(12) United States Patent
Campbell et al.

(10) Patent No.: US 11,079,408 B2
(45) Date of Patent: Aug. 3, 2021

(54) RESISTIVE TEST-PROBE TIPS

(71) Applicant: Tektronix, Inc., Beaverton, OR (US)

(72) Inventors: Julie A. Campbell, Beaverton, OR (US); Josiah A. Bartlett, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 167 days.

(21) Appl. No.: 16/165,928

(22) Filed: Oct. 19, 2018

(65) Prior Publication Data
US 2019/0353683 A1 Nov. 21, 2019

Related U.S. Application Data

(60) Provisional application No. 62/673,793, filed on May 18, 2018.

(51) Int. Cl.
*G01R 1/067* (2006.01)

(52) U.S. Cl.
CPC ..... *G01R 1/06772* (2013.01); *G01R 1/06722* (2013.01); *G01R 1/06755* (2013.01)

(58) Field of Classification Search
CPC ............ G01R 1/06772; G01R 1/06755; G01R 1/06722; G01R 1/06788; G01R 1/06733; G01R 1/06738; G01R 1/06761; H01C 7/001
See application file for complete search history.

(56) References Cited

U.S. PATENT DOCUMENTS

| 2,849,681 A | 8/1958 | Belart | |
| 7,242,202 B2* | 7/2007 | Groshong | G01R 1/06772 324/754.07 |
| 2013/0181110 A1* | 7/2013 | Sievers | H01L 31/18 250/206 |
| 2016/0187382 A1* | 6/2016 | Campbell | H01R 13/2421 324/755.05 |
| 2016/0291054 A1 | 10/2016 | Hagerup et al. | |

OTHER PUBLICATIONS

German Patent and Trade Mark Office, "Information on Identified Prior Art Provided" Nov. 26, 2019, 6 pages, Munich, Germany.

* cited by examiner

*Primary Examiner* — Christopher P McAndrew
*Assistant Examiner* — Zannatul Ferdous
(74) *Attorney, Agent, or Firm* — Miller Nash Graham & Dunn; Andrew J. Harrington

(57) ABSTRACT

A test-probe tip having a tip component, a resistive element, and a compliance member. The tip component is configured to electrically connect to a device under test at a first end of the tip component. The resistive element is electrically connected to a second end of the tip component along a signal-flow axis. The resistive element is configured to provide electrical impedance to an electrical signal passing through the resistive element. The compliance member is configured to allow movement of the tip component in a first direction when a mechanical force applied to the tip component in the first direction and to cause movement of the tip component in an opposite, second direction when the mechanical force applied to the tip component is removed or reduced. Architectures for the resistive element are also described.

16 Claims, 5 Drawing Sheets

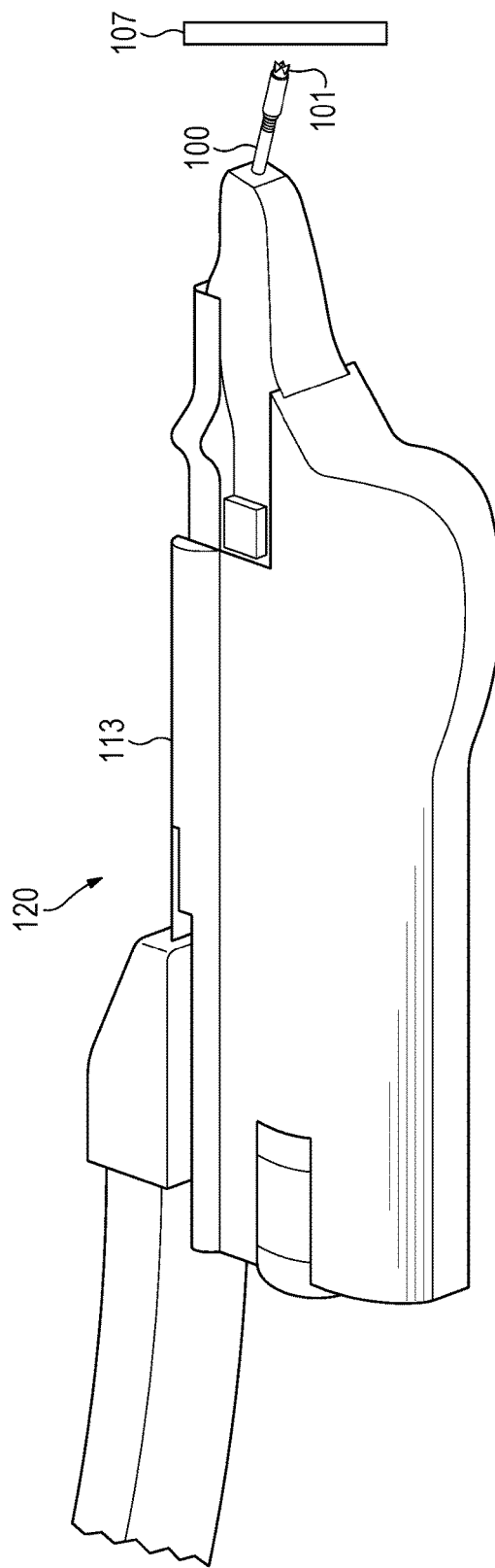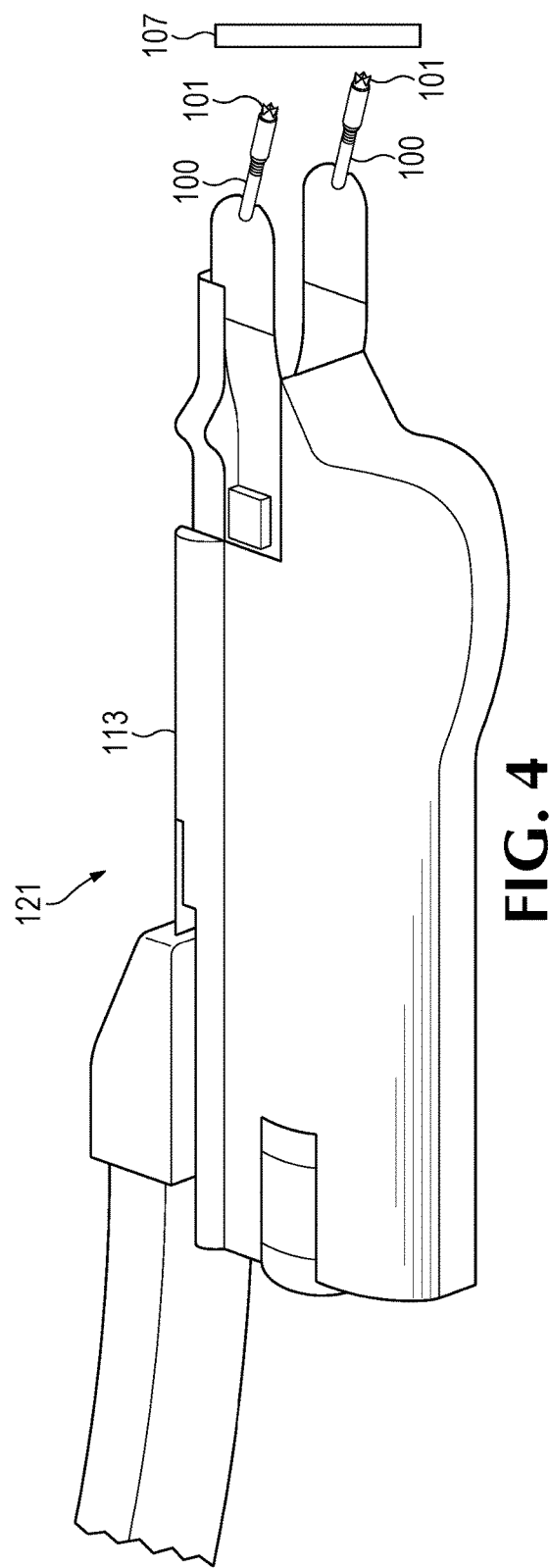

RESISTIVE TEST-PROBE TIPS

CROSS-REFERENCES TO RELATED APPLICATIONS

This patent application claims the benefit of provisional application No. 62/673,793 filed May 18, 2018, which is incorporated in this patent application by this reference.

FIELD OF THE INVENTION

This disclosure relates generally to test probes and, more particularly, to probe tips for test probes.

BACKGROUND

Today's engineers are attempting to test devices that carry high-speed serial busses. Many of these devices can be identified as, but are not limited to, double data rate second generation (DDR2) synchronous dynamic random-access memory (SDRAM), double data rate fourth generation (DDR4) SDRAM, and peripheral component interconnect express (PCIe). The magnitude of voltage swings and pulse frequencies are very high and the complexity of the signaling requires precise electrical probing. These and other busses are becoming highly prevalent in various types of consumer hardware devices. There are many test points of interest in each of these products.

The test points in these products can vary greatly in both geometry and accessibility, usually requiring one or two points of contact. Typically, points of contact include micro traces, vias, component pads, and connector contacts that provide electrical contact with and, thus, access to high-speed signals. However, the test points are not always in the same plane and, if two probe contacts are required at once (as in the case of a differential probe), tip compliance is desirable to assist with positioning the probe for proper contact. Points of contact may reside on principal component analysis (PCA) hardware in virtually every angle of orientation, including from vertical to horizontal. In these types of scenarios, the test points are better accessed by probe tips with compliance.

While there are semi-permanent forms of probe contact for these access points, including the soldering of wires to these points, such solutions present a number of disadvantages, including potential damage to the device under test (DUT) during connection, long set-up times, and a requirement for exceptional dexterity skills to solder wires to these test points. Also, semi-permanent contacts do not provide for quick debugging. Solder-in probe tips tend to wear out after only a few connections and, thus, create a need for replacements, which can be significantly expensive. Finally, there tends to be a high variability in the signal fidelity, particularly in upper signal frequencies, due to the quality and geometry of solder connections.

Embodiments of the disclosed technology address shortcomings in the prior art.

BRIEF DESCRIPTION OF THE DRAWINGS

FIG. 3 illustrates an example test-probe tip installed on an example test probe, according to embodiments.

FIG. 4 illustrates an example test-probe tip installed on an example test probe, according to embodiments.

Figure 1:
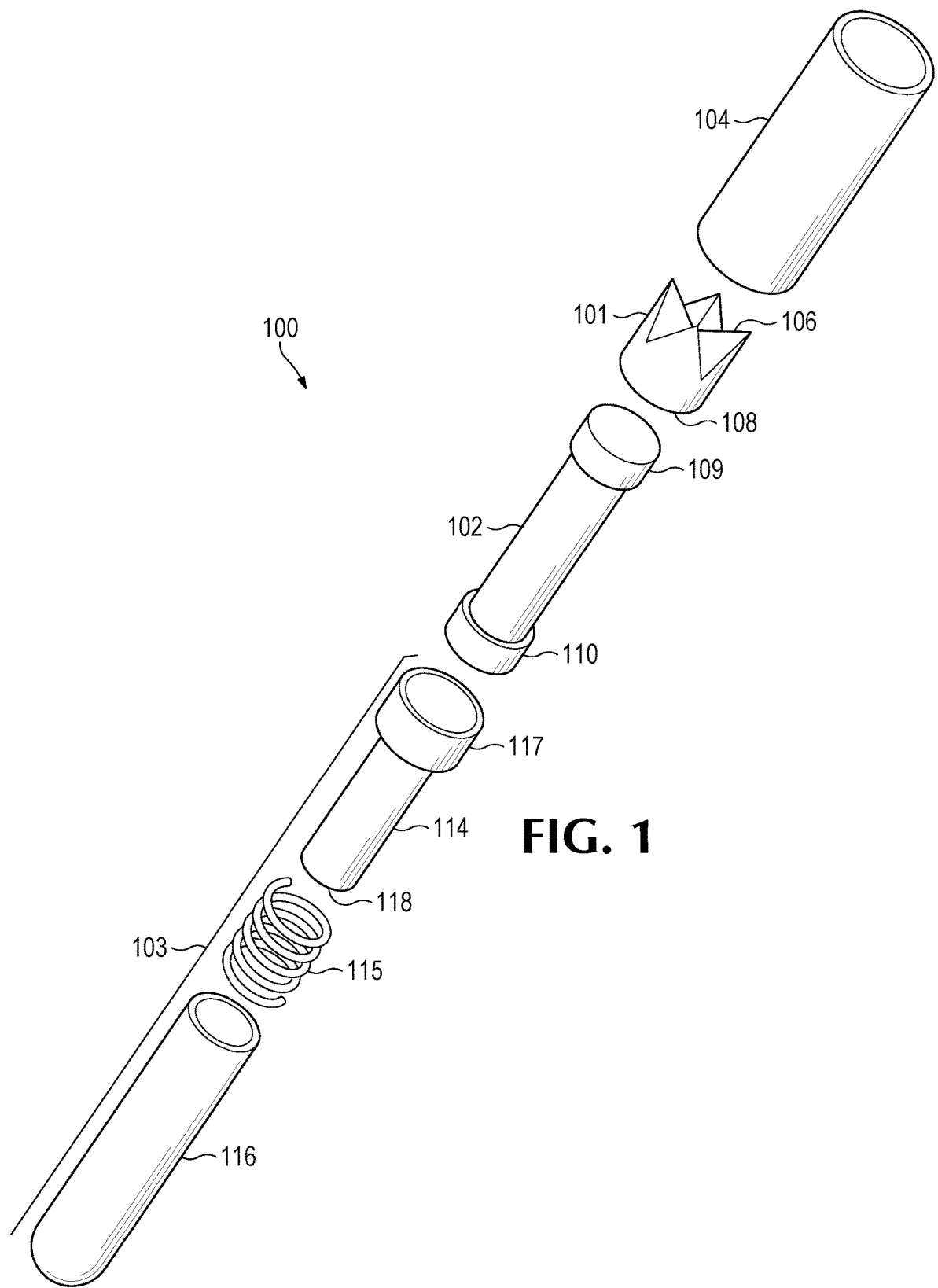
FIG. 1 is an exploded view of a test-probe tip, according to embodiments.

The depictions in the drawings are not necessarily to scale.

DETAILED DESCRIPTION

Embodiments of the disclosed technology generally include probe tips suitable for use with a test probe and configured to provide precise contact with a test point, for example, on a device under test (DUT). Such a test-probe tip may be configured as a spring probe that includes a resistive or impedance element positioned nearly at the point of contact with the DUT. The resistive or impedance element may greatly improve the through response of the spring probe and also decrease the DUT loading significantly, thus enabling high-speed signal acquisition. The spring, or compliance, element may reduce mechanical loads experienced by the test-probe tip.

Test probes and test-probe tips in accordance with the disclosed technology may advantageously create a better physical and electrical control of the contact area and also lend themselves well to fast debugging environments that typically cannot accommodate long contact setup times. Test probes and probe tips in accordance with the disclosed technology may advantageously provide superior visibility for connection placement and intuitive operation various classes of products, specifically hand-held or rapid placement probing.

Figures 2A, 2B:
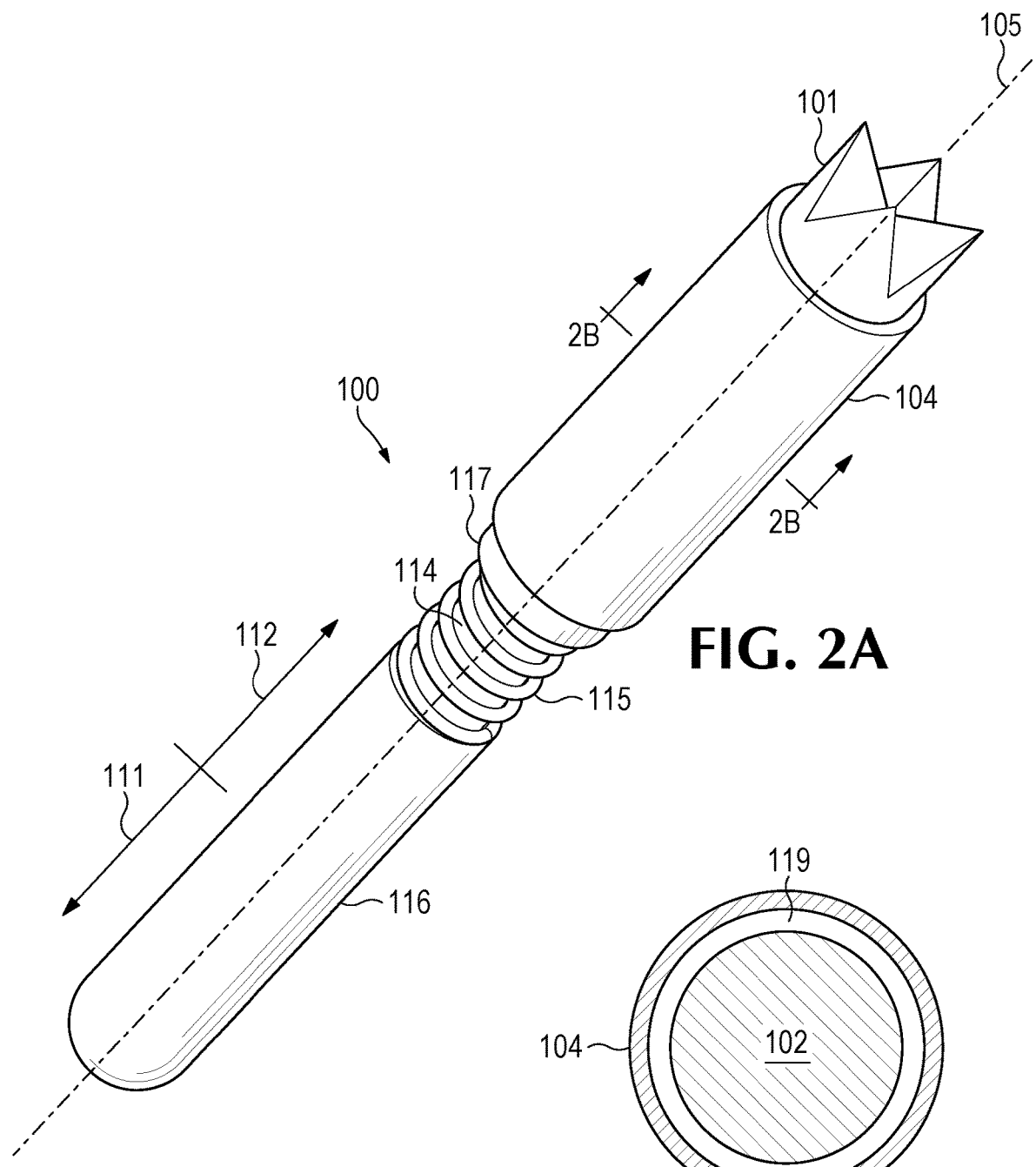
FIG. 2A is a side view of the test-probe tip of FIG. 1 when assembled.
FIG. 2B is a sectional view of the test-probe tip, taken along the line indicated in FIG. 2A.

FIG. 1 is an exploded view showing portions of a test-probe tip 100, according to embodiments. FIG. 2A is a side view of the assembled test-probe tip 100 of FIG. 1. FIG. 2B is a sectional view, taken along the line indicated in FIG. 2A. As illustrated in FIGS. 1, 2A and 2B, a test-probe tip 100 may include a tip component 101, a resistive element 102, a compliance member 103, and a structural member 104. During use, an electrical signal may be acquired by the tip component 101 and transmitted through the resistive element 102, defining a signal-flow axis 105 of the test-probe tip 100. As illustrated in FIG. 2A, the signal-flow axis may generally align with the longitudinal axis of the test-probe tip 100.

The tip component 101 may have a first end 106 that is configured to electrically connect to a device under test 107 (see FIGS. 3 and 4). For example, the tip component 101 may have one or more points to establish or otherwise facilitate fine-grain electrical connectivity with one or more contact points on a DUT 107. A second end 108 is opposite the first end 106 of the tip component 101 along the signal-flow axis 105 of the test-probe tip 100.

The resistive element 102 may be electrically coupled, at a first end 109 of the resistive element 102, to the second end 108 of the tip component 101 along the signal-flow axis 105 of the test-probe tip 100. The electrical coupling may be accomplished by surface contact, solder, conductive epoxy, or any other suitable method. The resistive element 102 is configured to provide electrical impedance to an electrical signal passing through the resistive element 102. The resistive element 102 may also have a second end 110 that is opposite the first end 109 of the resistive element 102 along the signal-flow axis 105 of the test-probe tip 100.

The resistive element 102 may be a conventional resistive element, or the resistive element 102 may be a specialized resistive element, such as those discussed below for FIGS. 5A-6B. If the resistive element 102 is a conventional resistive element, the resistive element may be, for example, a 0402 package style resistor, with a variable air gap to no air gap.

The resistive element 102 may be or include a conductive epoxy resistor having a suspended resistive material. The conductive epoxy may be formed, for example, within a tube that does not adhere to the epoxy. The tube may be, for example, made from polytetrafluoroethylene (PTFE), such as the PTFE provided under the TEFLON® brand. The amount of the resistive material suspended within the conductive epoxy may be increased or decreased to achieve a desired amount of resistance. Also, or alternatively, the resistance provided by the resistive element 102 may be tuned by removing material from the resistive element 102 (such as, for example, with a conventional diamond saw or laser) while monitoring the resulting resistance.

The resistive element 102 may be or include an elastomer having a suspended resistive material. The elastomer may be formed, for example, within a tube that does not adhere to the elastomer. The tube may be, for example, made from polytetrafluoroethylene (PTFE), such as the PTFE provided under the TEFLON® brand. The amount of the resistive material suspended within the elastomer may be increased or decreased to achieve a desired amount of resistance for the resistive element 102. Also, or alternatively, the resistance provided by the resistive element 102 may be tuned by removing material from the resistive element 102 (such as, for example, with a conventional diamond saw or laser) while monitoring the resulting resistance.

Such an elastomeric resistive element may be assembled by compressing the elastomer between the tip component 101 and the plunger base component 114 and then gluing, or otherwise fixing, the structural member 104 in place to ensure the elastomer remained in the compressed state, which would dictate some of the resistive characteristics of the elastomer. The amount of resistance may be measured while compressing the elastomer to ensure that the desired amount of resistance is achieved.

Instead of, or in addition to, the resistive element 102, embodiments may include a resistive epoxy to attach the tip component 101 to the DUT 107, thus providing a resistor between the test-probe tip 100 and the DUT 107. In such a scenario, the resistive aspects of the epoxy could be determined based on various calibration techniques.

The compliance member 103 may be configured to allow movement of the tip component 101 in a first axial direction 111 along the signal-flow axis 105 of the test-probe tip 100 when a mechanical force is applied to the tip component 101 in the first axial direction 111. For example, the mechanical force may result from the tip component 101 of the test-probe tip 100 contacting the DUT 107. The compliance member 103 may also be configured to cause movement of the tip component 101 in a second axial direction 112 along the signal-flow axis 105 of the test-probe tip 100 when the mechanical force applied to the tip component 101 is removed or reduced. The second axial direction 112 is opposite to the first axial direction 111.

Not all embodiments of the disclosed technology will include the compliance member 103. In such embodiments, the resistive element 102 could be connected to a test-probe body 113 (see FIGS. 3 and 4), such as the probe bodies described below.

The compliance member 103 may further include a plunger base component 114, a spring mechanism 115, and a barrel component 116.

The plunger base component 114 may be electrically coupled to the second end 110 of the resistive element 102 at a first end 117 of the plunger base component 114. The electrical coupling may be accomplished by surface contact, solder, conductive epoxy, or any other suitable method. A second end 118 of the plunger base component 114 is opposite the first end 117 of the plunger base component 114 along the signal-flow axis 105 of the test-probe tip 100. The second end 118 of the plunger base component 114 may be configured to slide inside the barrel component 116 and along the signal-flow axis 105 of the test-probe tip 100.

The barrel component 116 may have a spherical end, such as illustrated in FIGS. 1 and 2A. The spherical shape may, for example, facilitate insertion of the barrel component 116 into a receiving socket of the test probe 120 (see FIGS. 3 and 4). Even so, the barrel component 116 need not have a spherical end in all embodiments; other configurations may also be used.

The spring mechanism 115 may be at least partially within the barrel component 116. The spring mechanism 115 may be configured to allow movement of the plunger base component 114 within the barrel component 116 in the first axial direction 111 when the mechanical force is applied to the tip component 101 in the first axial direction 111. The spring mechanism 115 may also be configured to cause movement of the plunger base component 114 within the barrel component 116 in the second axial direction 112 when the mechanical force is removed or reduced. The spring mechanism 115 may be, for example, a helical compression spring, such as the example spring shown in FIG. 1. Accordingly, the helical compression spring may compress when the mechanical force is applied to the tip component 101 in the first axial direction 111 and to expand when the mechanical force is removed or reduced. As another example, the spring mechanism 115 may be a resilient disk or puck, or a torsion spring.

The structural member 104 may structurally couple tip component 101 to the plunger base component 114, and the resistive element 102 may be within the structural member 104. Because the resistive element 102 may not be of sufficient structural integrity by itself, the structural member 104 may transmit to the compliance member 103 all or part of the mechanical force applied to the tip component 101. The structural member 104 may be mechanically coupled to the plunger base component 114 and to the tip component 101 with glue, epoxy, retention screw, or any other suitable chemical or mechanical fastener. The structural member 104 may be composed of a non-conductive material, such as plastic. While structural member 104 is depicted as a solid structure, in embodiments the structural member 104 may include voids such as, for example, holes or vents.

In embodiments, an inside diameter of the structural member 104 is greater than an outside diameter of the resistive element 102 to ensure an air gap 119 between the resistive element 102 and the structural member 104. An example of this configuration is shown in FIG. 2B. The air gap 119 may help ensure that the structural member 104 does not impact the electrical properties of the resistive element 102. The size of the air gap 119 (specifically, the distance between the outside diameter of the resistive element 102 and the inside diameter of the structural member 104) could be selected based on the configuration of the test-probe tip 100 or the signal being captured by the test-probe tip 100 and thus could vary depending upon the desired implementation.

FIG. 3 illustrates an example test-probe tip 100 installed on an example test probe 120. As shown in FIG. 3, a single-tip test probe 120 may include a test-probe tip 100 installed on a test-probe body 113. The test probe 120 may be, for example, the test probe of a test and measurement device. The test-probe tip 100 may be installed on the example test probe 120 by, for example, inserting the barrel component 116 (see FIGS. 1 and 2A) into a receiving socket of the test probe 120. The receiving socket may be, for example, soldered onto a flex circuit that is part of the test probe 120.

Accordingly, the test probe 120 may acquire an electrical signal from the DUT 107 by positioning the tip component 101 of the test-probe tip 100 against a target area of the DUT 107. Hence, for example, a user may use the test probe 120 to create a compression resistance between the test-probe tip 100 and a test point on the DUT 107, such as, for example, a high-speed signal-access point.

FIG. 4 illustrates example test-probe tips 100 installed on an example test probe 121. As shown in FIG. 4, a double-tipped, differential test probe 121 may include two test-probe tips 100 installed on a test-probe body 113. The test probe 121 may be, for example, the test probe of a test and measurement device. Each of the test-probe tips 100 may be installed on the example test probe 121 by, for example, inserting the barrel component 116 (see FIGS. 1 and 2A) into a receiving socket of the test probe 121. The receiving socket may be, for example, soldered onto a flex circuit that is part of the test probe 121.

Accordingly, the test probe 121 may acquire a differential electrical signal from the device-under-test by positioning the tip component 101 of each of the test-probe tips 100 against a target area of the device-under-test. Hence, for example, a user may use the test probe 121 to create a compression resistance between one of the test-probe tips 100 and a test point (or both of the test-probe tips 100 and two test points) on the DUT 107, such as, for example, a high-speed signal-access point.

Figure 5A:
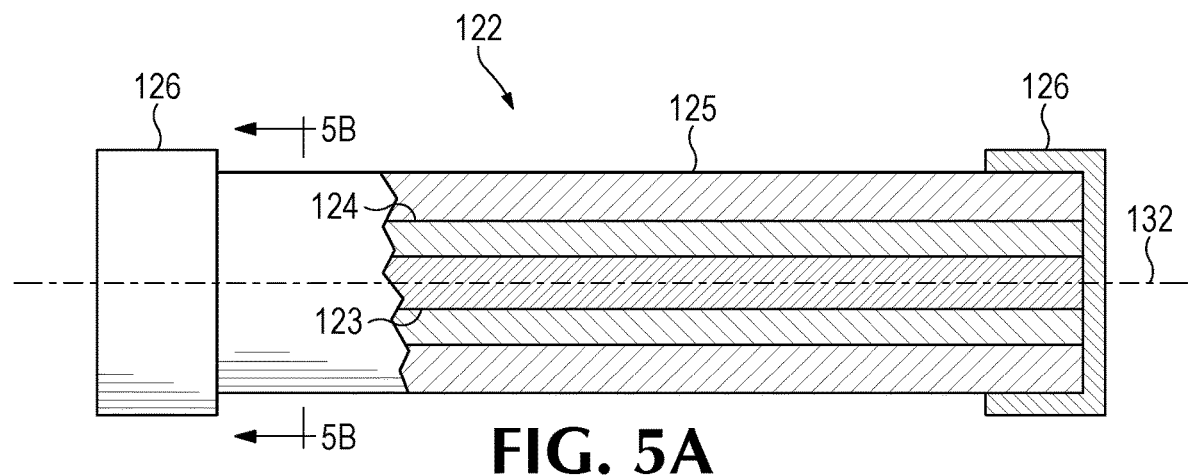
FIG. 5A is a side, sectional view of a resistive element, according to embodiments.
Figure 5B:
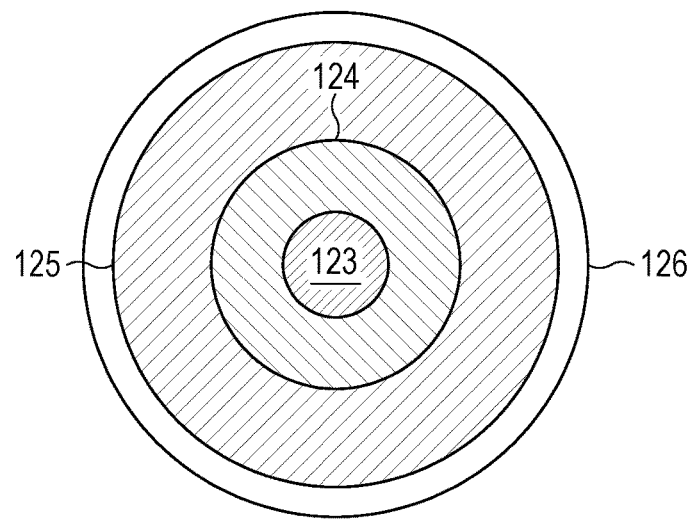
FIG. 5B is a cross-sectional view of the resistive element of FIG. 5A, taken along a line that is perpendicular to a signal-flow axis of the resistive element.

FIG. 5A is a side, partial sectional view showing portions of a resistive element 122, according to embodiments. The section is taken along a cutting plane that is parallel to a signal-flow axis 132 of the resistive element 122. The resistive element 122 of FIG. 5A may be, for example, the resistive element 102 of FIG. 1. FIG. 5B is a cross-sectional view of the resistive element 122 of FIG. 5A, taken along a cutting plane that is perpendicular to the signal-flow axis 132 of the resistive element 122. During use, an electrical signal passes through the resistive element 122 in the direction of the signal flow axis 132. As illustrated in FIG. 5A, the signal-flow axis 132 may generally align with the longitudinal axis of the resistive element 122. When the resistive element 122 is part of a test-probe tip, such as the test-probe tip 100 of FIGS. 1-2B, the signal-flow axis 132 of the resistive element 122 may generally align with the signal-flow axis 105 of the test-probe tip 100.

As illustrated in FIGS. 5A and 5B, the resistive element 122 may include a first layer 123 having a first impedance and a second layer 124 having a second impedance. The second impedance may be greater than the first impedance, and the first layer 123 and the second layer 124 may be concentric. Here, "concentric" means having a common center. The layers (the first layer 123 and the second layer 124) in cross section may be regular polygons, rectangles, circles, or other shapes having an identifiable center point in cross-section, where the cross-section is perpendicular to a signal-flow axis 132 of the resistive element 122.

In embodiments, such as shown in FIG. 5B, the second layer 124 surrounds the first layer 123. In other embodiments, the first layer 123 surrounds the second layer 124. In embodiments, the second impedance of the second layer 124 may be much greater than the first impedance of the first layer 123 such that the second layer 124 is substantially an insulator.

As illustrated in FIGS. 5A and 5B, the resistive element 122 may further include a third layer 125 having a third impedance that is greater than the second impedance. The first layer 123, the second layer 124, and the third layer 125 may be concentric. In a cross-section perpendicular to the signal-flow axis 132 of the resistive element 122, the second layer 124 may surround the first layer 123 and the third layer 125 may surround the second layer 124. Hence, the impedance values of the layers may increase from the innermost layer to the outermost layer. Because higher frequencies travel further from the center of a resistor, a configuration where the impedance values of the layers increase from the innermost layer to the outermost layer would enable direct current (DC) and low frequency (LF) components of a signal to pass through the center of the resistive element 122 with relatively little resistance, while higher frequency components of the signal would experience increasing resistance.

In other embodiments, the impedance values of the layers may decrease from the innermost layer to the outermost layer. In still other embodiments, the impedance value of a middle layer may be higher than the impedance values of the adjacent two layers.

The resistive element 122 may include metallic layers 126. The metallic layers 126 may include any suitable material for making an electrical connection with the plunger base component 114 and the tip component 101. Such materials may include, silver, gold, copper, or any other suitably electrically conductive material, or combinations of any of those materials. The metallic layers 126 can be applied utilizing any suitable process, such as a micro-penning process. The metallic layers 126 may be formed as caps, or the metallic layers 126 may be formed to leave either end (or both ends) of the resistive layers exposed.

While FIGS. 5A and 5B depicts three concentric resistive layers, more or fewer resistive layers are within the scope of this disclosure. Specifically, any resistor having two or more resistive layers is expressly contemplated.

Figure 6A:
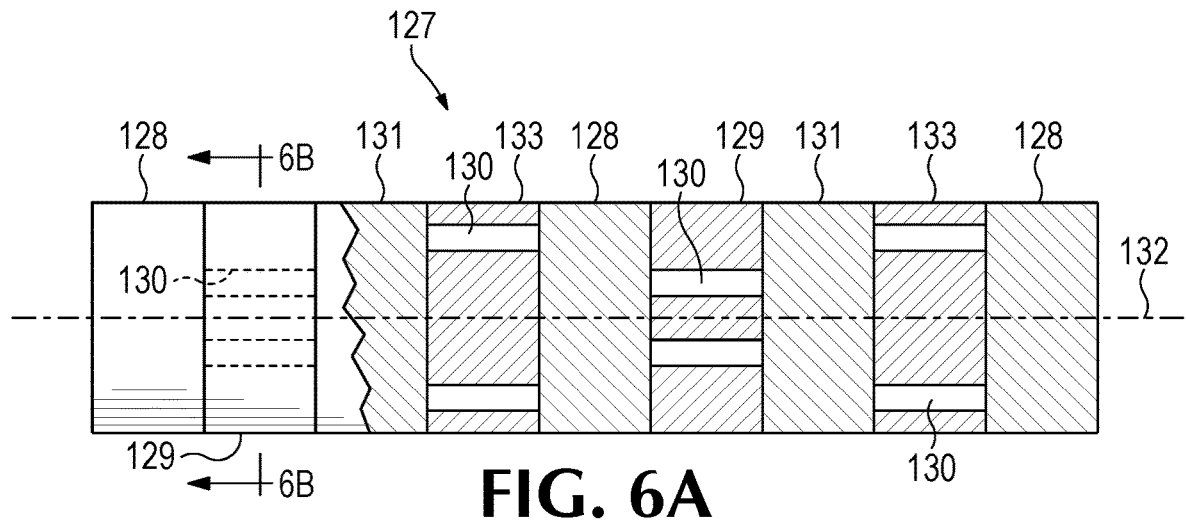
FIG. 6A is a side, sectional view of a resistive element, according to embodiments.
Figure 6B:
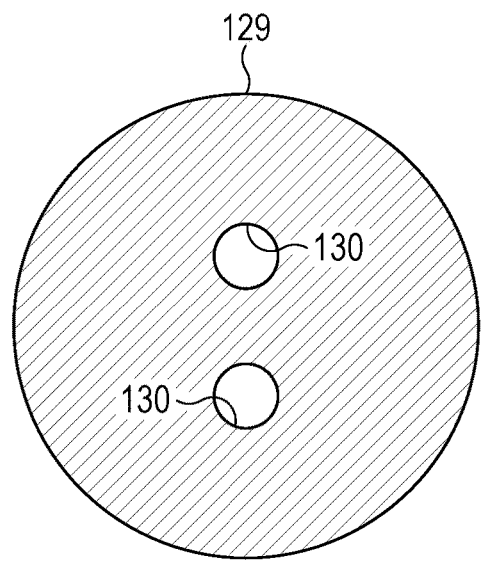
FIG. 6B is a cross-sectional view of the resistive element of FIG. 6A, taken along a line that is perpendicular to a signal-flow axis of the resistive element.

FIG. 6A is a side, partial sectional view showing portions of a resistive element 127, according to embodiments. The section is taken along a cutting plane that is parallel to a signal-flow axis 132 of the resistive element 127. The resistive element 127 of FIG. 6A may be, for example, the resistive element 102 of FIG. 1. FIG. 6B is a cross-sectional view of the resistive element 127 of FIG. 6A, taken along a cutting plane that is perpendicular to the signal-flow axis 132 of the resistive element 127 through an example second layer 129 of the resistive element 127. During use, an electrical signal passes through the resistive element 127 in the direction of the signal flow axis 132. As illustrated in FIG. 6A, the signal-flow axis 132 may generally align with the longitudinal axis of the resistive element 127. When the resistive element 127 is part of a test-probe tip, such as the test-probe tip 100 of FIGS. 1-2B, the signal-flow axis 132 of the resistive element 127 may substantially align with the signal-flow axis 105 of the test-probe tip 100.

As illustrated in FIGS. 6A and 6B, the resistive element 127 may include a first layer 128 having a first impedance and a second layer 129, 133 having a second impedance. The second impedance may be greater than the first impedance, and the first layer 128 and the second layers 129, 133 may be orthogonal to the signal-flow axis 132 of the resistive element 127. The second layers 129, 133 may be electrically nonconductive.

In embodiments, the second layers 129, 133 may include a via 130 passing through the second layer 129, 133. The via 130 may be parallel to the signal-flow axis 132 of the resistive element 127, and the via 130 may be plated or filled with a conductive material. In embodiments, the second layers 129, 133 may have more than one via 130. The via or vias 130 may be at different distances from the signal-flow axis 132, such as illustrated in FIG. 6A for the second layer 129 and the second layer 133, to achieve, for example, different effects on an electrical signal passing through the second layer 129, 133. The via 130 may be configured to allow the electrical signal to pass through the respective second layer 129, 133 to the next layer. Such a configuration may, for example, enable the DC and LF components of the electrical signal to pass essentially unimpeded through the second layers 129, 133, while the higher frequency components of the electrical signal are forced to jump from one layer to the next, thus slowing the higher frequency components of the electrical signal. For example, the higher frequency components may capacitively couple to the next conductive layer.

As illustrated in FIGS. 6A and 6B, the resistive element 127 may further include a third layer 131 orthogonal to the signal-flow axis 105 of the test-probe tip 100. The third layer 131 has a third impedance that is lower than the second impedance. In embodiments, the first impedance (of the first layer 128) and the third impedance (of the third layer 131) may be equivalent. The second layer 129, 133 may be between the first layer 128 and the third layer 131. The first layer 128 and the third layer 131 may each be electrically conductive. As illustrated in the example implementation of FIGS. 6A-6B, may have alternating conductive layers (the first layer 128 and the third layer 131) and nonconductive layers (the second layers 129, 133). The example of FIGS. 6A-6B is just one possible implementation of alternating the layers.

The conductive layers may be or include any suitably conductive material. Such materials may include, silver, gold, copper, or any other suitably electrically conductive material, or combinations of any of those conductive materials. The non-conductive layers may be or include any suitable insulative material such as, for example, plastic.

EXAMPLES

Illustrative examples of the disclosed technologies are provided below. An embodiment of the technologies may include one or more, and any combination of, the examples described below.

Example 1 includes a test-probe tip comprising: a tip component having a first end configured to electrically connect to a device under test, and a second end that is opposite the first end of the tip component along a signal-flow axis of the test-probe tip; a resistive element electrically connected to the second end of the tip component along the signal-flow axis, the resistive element being configured to provide electrical impedance to an electrical signal passing through the resistive element; and a compliance member configured to allow movement of the tip component in a first axial direction along the signal-flow axis of the test-probe tip when a mechanical force applied to the tip component in the first axial direction and to cause movement of the tip component in a second axial direction along the signal-flow axis of the test-probe tip, the second axial direction being opposite to the first axial direction, when the mechanical force applied to the tip component is removed or reduced.

Example 2 includes the test-probe tip of Example 1, in which the resistive element is electrically connected to the second end of the tip component at a first end of the resistive element, in which the compliance member includes a plunger base component electrically coupled to a second end of the resistive element, the second end of the resistive element being opposite the first end of the resistive element along the signal-flow axis of the test-probe tip.

Example 3 includes the test-probe tip of any of Examples 1-2, further comprising a structural member, the structural member structurally coupling the tip component to the compliance member.

Example 4 includes the test-probe tip of Example 3, in which the resistive element is within the structural member.

Example 5 includes the test-probe tip of any of Examples 1-4, in which the plunger base component is electrically coupled to the second end of the resistive element at a first end of the plunger base component, in which the compliance member further includes a barrel component, and in which a second end of the plunger base component is configured to slide inside the barrel component and along the signal-flow axis of the test-probe tip, the second end of the plunger base component being opposite the first end of the plunger base component along the signal-flow axis of the test-probe tip.

Example 6 includes the test-probe tip of any of Examples 1-5, in which the compliance member further includes a spring mechanism within the barrel component, the spring mechanism being configured to allow movement of the plunger base component within the barrel component in the first axial direction when the mechanical force applied to the tip component in the first axial direction and to cause movement of the plunger base component within the barrel component in the second axial direction when the mechanical force is removed or reduced.

Example 7 includes the test-probe tip of any of Examples 1-6, in which the resistive element comprises a first layer having a first impedance and a second layer having a second impedance, the second impedance being greater than the first impedance.

Example 8 includes the test-probe tip of any of Examples 1-7, in which the first layer and the second layer are concentric.

Example 9 includes the test-probe tip of any of Examples 1-8, in which, in a cross-section perpendicular to the signal-flow axis of the test-probe tip, the second layer surrounds the first layer.

Example 10 includes the test-probe tip of any of Examples 1-9, in which the resistive element further comprises a third layer having a third impedance, the third impedance being greater than the second impedance, in which the first layer, the second layer, and the third layer are concentric, and in which, in a cross-section perpendicular to the signal-flow axis of the test-probe tip, the second layer surrounds the first layer and the third layer surrounds the second layer.

Example 11 includes the test-probe tip of any of Examples 1-7, in which the first layer and the second layer are orthogonal to the signal-flow axis of the test-probe tip.

Example 12 includes the test-probe tip of Example 11, in which the second layer is electrically nonconductive and comprises a via passing through the second layer, parallel to the signal-flow axis of the test-probe tip.

Example 13 includes the test-probe tip of any of Examples 11-12, further comprising a third layer orthogonal to the signal-flow axis of the test-probe tip, the third layer having a third impedance that is lower than the second impedance, the second layer being between the first layer and the third layer, the first layer and the third layer each being electrically conductive.

Example 14 includes the test-probe tip of any of Examples 1-13, in which the resistive element comprises a material selected from the group consisting of a conductive epoxy resistor having a suspended resistive material or an elastomer having a suspended resistive material.

Example 15 includes a resistive element configured to provide electrical impedance to an electrical signal passing along a signal-flow axis of the resistive element, the resistive element comprising: a first layer having a first impedance; and a second layer having a second impedance, the second impedance being greater than the first impedance.

Example 16 includes the resistive element of Example 15, in which the first layer and the second layer are concentric.

Example 17 includes the resistive element of any of Examples 15-16, in which, in a cross-section perpendicular to the signal-flow axis, the second layer surrounds the first layer.

Example 18 includes the resistive element of any of Examples 15-16, in which, in a cross-section perpendicular to the signal-flow axis, the first layer surrounds the second layer, and in which the second layer is substantially an insulator.

Example 19 includes the resistive element of any of Examples 15-17, in which the resistive element further comprises a third layer having a third impedance, the third impedance being greater than the second impedance, in which the first layer, the second layer, and the third layer are concentric, and in which, in a cross-section perpendicular to the signal-flow axis, the second layer surrounds the first layer and the third layer surrounds the second layer.

Example 20 includes the resistive element of Example 15, in which the first layer and the second layer are orthogonal to the signal-flow axis.

Example 21 includes the resistive element of Example 20, in which the second layer is electrically nonconductive and comprises a via passing through the second layer, parallel to the signal-flow axis.

Example 22 includes the resistive element of any of Examples 20-21, further comprising a third layer orthogonal to the signal-flow axis, the third layer having a third impedance that is lower than the second impedance, the second layer being between the first layer and the third layer, the first layer and the third layer each being electrically conductive.

Embodiments may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A test-probe tip comprising:
a tip component having a first end configured to electrically connect to a device under test, and a second end that is opposite the first end of the tip component along a signal-flow axis of the test-probe tip;
a resistive element electrically connected to the second end of the tip component along the signal-flow axis, the resistive element being configured to provide electrical impedance to an electrical signal passing through the resistive element;
a compliance member configured to allow movement of the tip component in a first axial direction along the signal-flow axis of the test-probe tip when a mechanical force applied to the tip component in the first axial direction and to cause movement of the tip component in a second axial direction along the signal-flow axis of the test-probe tip, the second axial direction being opposite to the first axial direction, when the mechanical force applied to the tip component is removed or reduced; and
a structural member, the structural member structurally coupling the tip component to the compliance member;

an air gap between the structural member and the resistive element;

in which the first layer and the second layer are concentric;

in which, in a cross-section perpendicular to the signal-flow axis of the test-probe tip, the second layer surrounds the first layer.

2. The test-probe tip of claim 1, in which the resistive element is electrically connected to the second end of the tip component at a first end of the resistive element, in which the compliance member includes a plunger base component electrically coupled to a second end of the resistive element, the second end of the resistive element being opposite the first end of the resistive element along the signal-flow axis of the test-probe tip.

3. The test-probe tip of claim 1, in which the resistive element is within the structural member.

4. The test-probe tip of claim 2, in which the plunger base component is electrically coupled to the second end of the resistive element at a first end of the plunger base component, in which the compliance member further includes a barrel component, and in which a second end of the plunger base component is configured to slide inside the barrel component and along the signal-flow axis of the test-probe tip, the second end of the plunger base component being opposite the first end of the plunger base component along the signal-flow axis of the test-probe tip.

5. The test-probe tip of claim 4, in which the compliance member further includes a spring mechanism within the barrel component, the spring mechanism being configured to allow movement of the plunger base component within the barrel component in the first axial direction when the mechanical force applied to the tip component in the first axial direction and to cause movement of the plunger base component within the barrel component in the second axial direction when the mechanical force is removed or reduced.

6. The test-probe tip of claim 1, in which the resistive element comprises a first layer having a first impedance and a second layer having a second impedance, the second impedance being greater than the first impedance.

7. The test-probe tip of claim 6, in which the resistive element further comprises a third layer having a third impedance, the third impedance being greater than the second impedance, in which the first layer, the second layer, and the third layer are concentric, and in which, in a cross-section perpendicular to the signal-flow axis of the test-probe tip, the second layer surrounds the first layer and the third layer surrounds the second layer.

8. The test-probe tip of claim 6, in which the first layer and the second layer are orthogonal to the signal-flow axis of the test-probe tip.

9. The test-probe tip of claim 8, in which the second layer is electrically nonconductive and comprises a via passing through the second layer, parallel to the signal-flow axis of the test-probe tip.

10. The test-probe tip of claim 9, further comprising a third layer orthogonal to the signal-flow axis of the test-probe tip, the third layer having a third impedance that is lower than the second impedance, the second layer being between the first layer and the third layer, the first layer and the third layer each being electrically conductive.

11. The test-probe tip of claim 1, in which the resistive element comprises a material selected from the group consisting of a conductive epoxy resistor having a suspended resistive material or an elastomer having a suspended resistive material.

12. A resistive element configured to provide electrical impedance to an electrical signal passing along a signal-flow axis of the resistive element, the resistive element comprising:

a first layer having a first impedance;

a second layer having a second impedance, the second impedance being greater than the first impedance, in which the first layer and the second layer are concentric in which, in a cross-section perpendicular to the signal-flow axis, the second layer surrounds the first layer; and in which the second layer is substantially an insulator.

13. The resistive element of claim 12, in which the resistive element further comprises a third layer having a third impedance, the third impedance being greater than the second impedance, in which the first layer, the second layer, and the third layer are concentric, and in which, in a cross-section perpendicular to the signal-flow axis, the second layer surrounds the first layer and the third layer surrounds the second layer.

14. The resistive element of claim 12, in which the first layer and the second layer are orthogonal to the signal-flow axis.

15. The resistive element of claim 14, in which the second layer is electrically nonconductive and comprises a via passing through the second layer, parallel to the signal-flow axis.

16. The resistive element of claim 15, further comprising a third layer orthogonal to the signal-flow axis, the third layer having a third impedance that is lower than the second impedance, the second layer being between the first layer and the third layer, the first layer and the third layer each being electrically conductive.

* * * * *